(12) United States Patent
Lim

(10) Patent No.: US 7,327,617 B2
(45) Date of Patent: Feb. 5, 2008

(54) MEMORY ADDRESS GENERATING CIRCUIT AND MEMORY CONTROLLER USING THE SAME

(75) Inventor: Min-Soo Lim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 38 days.

(21) Appl. No.: 11/349,860

(22) Filed: Feb. 8, 2006

(65) Prior Publication Data
US 2006/0181940 A1  Aug. 17, 2006

(30) Foreign Application Priority Data
Feb. 12, 2005 (KR) .............. 10-2005-0011736

(51) Int. Cl.
*G11C 7/00* (2006.01)
(52) U.S. Cl. ............. 365/193; 365/230.02; 365/230.03
(58) Field of Classification Search ............... 365/193, 365/230.02, 230.03, 233, 189.02
See application file for complete search history.

(56) References Cited

U.S. PATENT DOCUMENTS

| | | | | |
|---|---|---|---|---|
| 4,937,791 A | * | 6/1990 | Steele et al. ........... | 365/230.03 |
| 5,392,252 A | * | 2/1995 | Rimpo et al. .......... | 365/230.02 |
| 5,537,361 A | * | 7/1996 | Ooishi .................... | 365/230.06 |
| 6,108,745 A | | 8/2000 | Gupta et al. | |
| 6,879,527 B2 | * | 4/2005 | Kwon et al. ................ | 365/193 |

FOREIGN PATENT DOCUMENTS

| | | |
|---|---|---|
| JP | 05144254 | 6/1993 |
| JP | 05282193 | 10/1993 |
| KR | 9624980 | 7/1996 |
| KR | 10 0243032 | 11/1999 |

\* cited by examiner

*Primary Examiner*—David Lam
(74) *Attorney, Agent, or Firm*—F. Chau & Associates, LLC

(57) ABSTRACT

Provided are a memory address generating circuit through which a user can freely select a method of generating an address of a memory according to an environment in which the memory is applied, and a memory controller including the memory address generating circuit. The memory address generating circuit includes a CAS address selecting circuit and an RAS address selecting circuit. The CAS address selecting circuit outputs a CAS address signal using N (N is an integer) column address signals and M (M is an integer) CAS address select signals. The RAS address selecting circuit which outputs an RAS address signal using K (K is an integer) row address signals and L (L is an integer) RAS address select signals. The memory address generating circuit controls the CAS address select signals and the RAS address select signals to perform a memory mapping most suitable for a system in which the memory is used.

17 Claims, 6 Drawing Sheets

US 7,327,617 B2

MEMORY ADDRESS GENERATING CIRCUIT AND MEMORY CONTROLLER USING THE SAME

BACKGROUND OF THE INVENTION

This application claims the priority of Korean Patent Application No. 10-2005-0011736, filed on Feb. 12, 2005 in the Korean Intellectual Property Office, the disclosure of which is incorporated herein in its entirety by reference.

1. Field of the Invention

The present invention relates to a memory device, and more particularly, to a method of generating a memory address for efficiently accessing a memory.

2. Description of the Related Art

Semiconductor memory devices enable storage of data having predetermined information at an inexpensive price. In particular, usage areas of dynamic random access memories (DRAMs) are expanding and memory capacity is also continually increasing.

Memories are used in various environments, and thus conditions for generating addresses for accessing the memories are also different for each usage environment. When a memory is used in a mobile communication environment, for example, in a mobile phone or a personal digital assistant (PDA), a method of generating addresses to access the memory that consumes less power is more effective and useful than a method of generating addresses that reduces the access time of the memory. This is because sufficient power cannot be continuously supplied to the mobile phone and the PDA due to the limited capacity of mobile batteries.

Conversely, in the case of a set-top box, a method of generating addresses that accesses the memory more quickly even if power consumption is high is more useful. Both methods may be required depending on an environment in which the memory is used.

A conventional method of generating memory addresses used to access the memory is applicable only in a limited number of environments.

SUMMARY OF THE INVENTION

The present invention provides a memory address generating circuit through which a user can freely select a method of generating an address of a memory according to an environment in which the memory is applied.

The present invention also provides a memory controller through which a user can freely select a method of generating an address of a memory according to an environment in which the memory is applied.

According to an aspect of the present invention, there is provided a memory address generating circuit for accessing a memory including a plurality of memory banks, each of the memory banks being divided into a plurality of pages of predetermined sizes. The memory address generating circuit includes: a column address strobe (CAS) address selecting circuit and a row address strobe (RAS) address selecting circuit.

The CAS address selecting circuit outputs a CAS address signals using N (where N is a constant) column address signals and M (where M is a constant) CAS address select signals. The RAS address selecting circuit outputs an RAS address signal using K (where K a constant) row address signals and L (where L is a constant) RAS address select signals.

The memory address generating circuit controls the CAS address select signals and the RAS address select signals to perform a memory mapping method most suitable for a system in which the memory is used.

According to another aspect of the present invention, there is provided a memory controller for accessing a memory including a plurality of memory banks, each of the memory banks being divided into a plurality of pages of predetermined sizes. The memory controller includes: an address select control device, an address generating device, a CAS address selecting circuit, and an RAS address selecting circuit.

The address select control device generates M (where M is a constant) CAS address select signals and L (where L is a constant) RAS address select signals. The address generating device generates N (where N is a constant) column address signals and K (where K is a constant) row address signals. The CAS address selecting circuit outputs a CAS address signal using the N column address signals and the M CAS address select signals. The RAS address selecting circuit outputs an RAS address signal using the K row address signals and the L RAS address select signals.

The memory controller controls the CAS address select signals and the RAS address select signals so that the memory mapping method most suitable for a system in which the memory is used can be performed.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
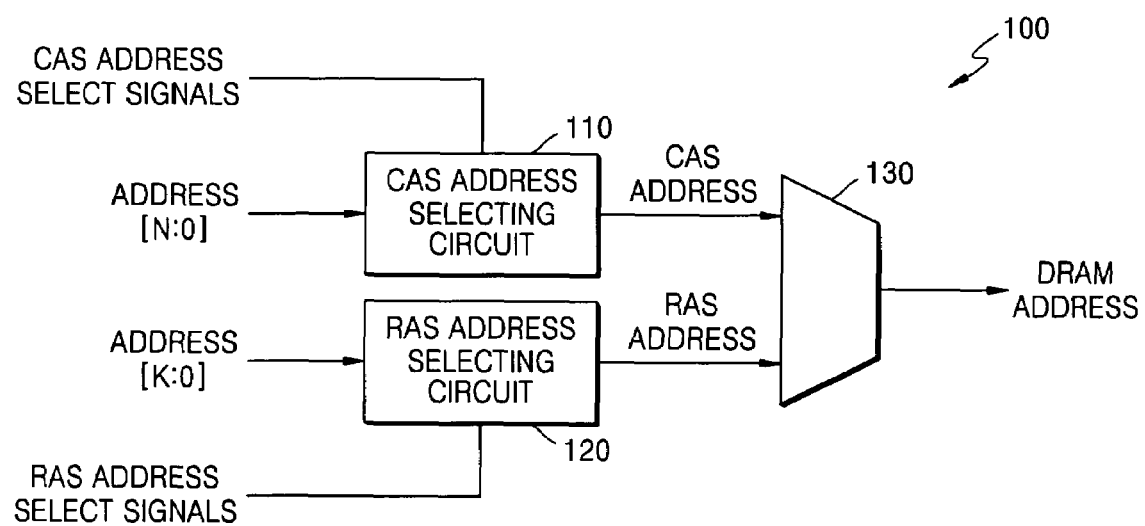
FIG. 1 is a block diagram of a memory address generating circuit according to an embodiment of the present invention.

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Like reference numerals in the drawings denote like elements.

FIG. 1 is a block diagram of a memory address generating circuit 100 according to an embodiment of the present invention. Referring to FIG. 1, the memory address generating circuit 100 includes a plurality of memory banks. Each of the memory banks outputs a memory address signal to access a memory divided into a plurality of pages. To do this, the memory address generating circuit 100 includes a column address strobe (CAS) address selecting circuit 110, a row address strobe (RAS) address selecting circuit 120, and a multiplexer 130.

The CAS address selecting circuit 100 outputs a CAS address signal using a column address signal (address [N:0]) of N bits (N is an integer) and a CAS address select signal. The RAS address selecting circuit 120 outputs an RAS address signal using a row address signal (address [K:0]) of K bits (K is an integer) and an RAS address select signal. The multiplexer 130 selects and outputs one of the CAS address signal and the RAS address signal.

The system user may control the CAS address select signal and the RAS address select signal to make most suitable memory mapping for a system in which the memory is used.

Figure 2A:
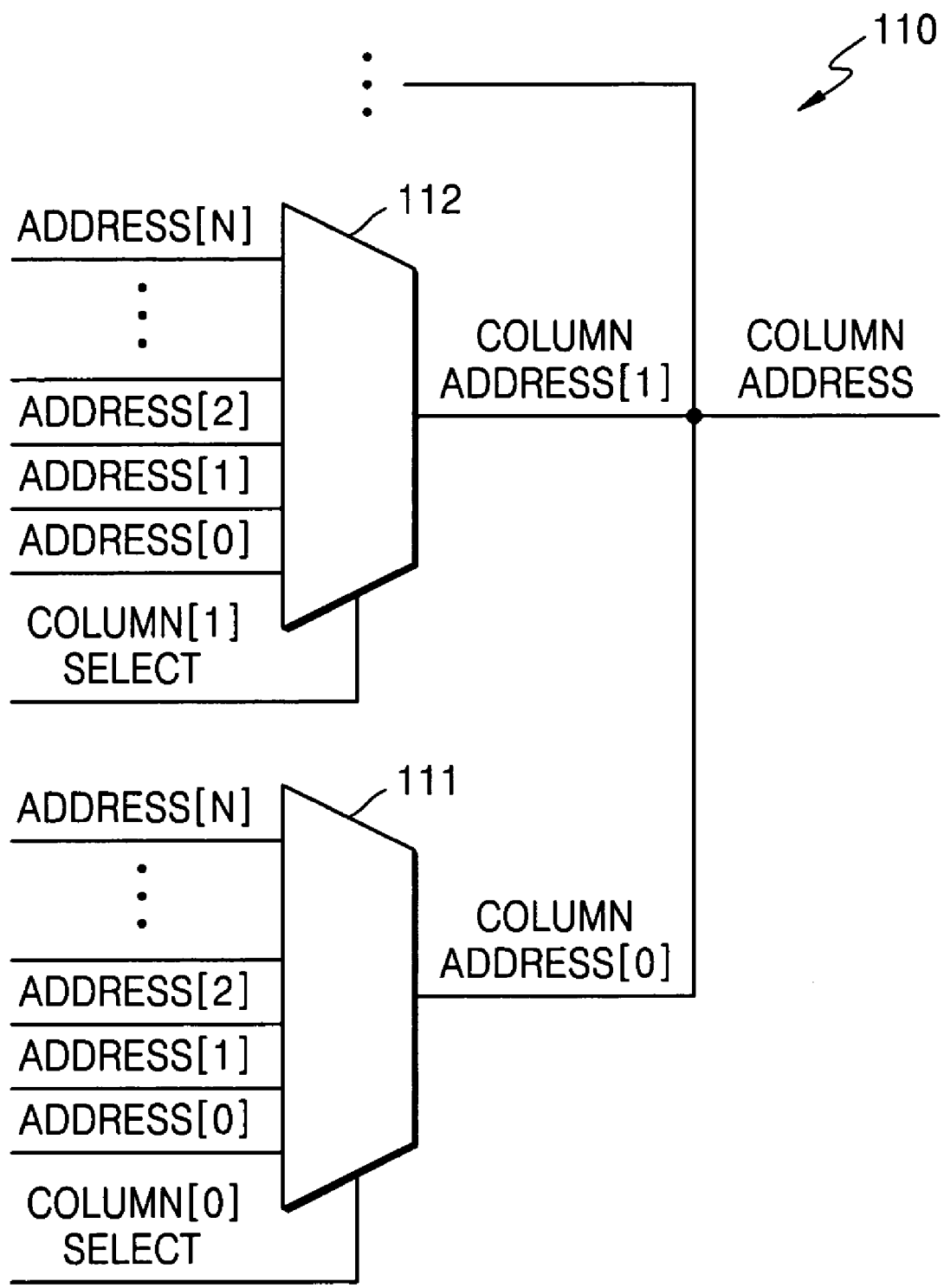
FIGS. 2A and 2B are exemplary detailed views of the memory address generating circuit illustrated in FIG. 1.
Figure 2B:
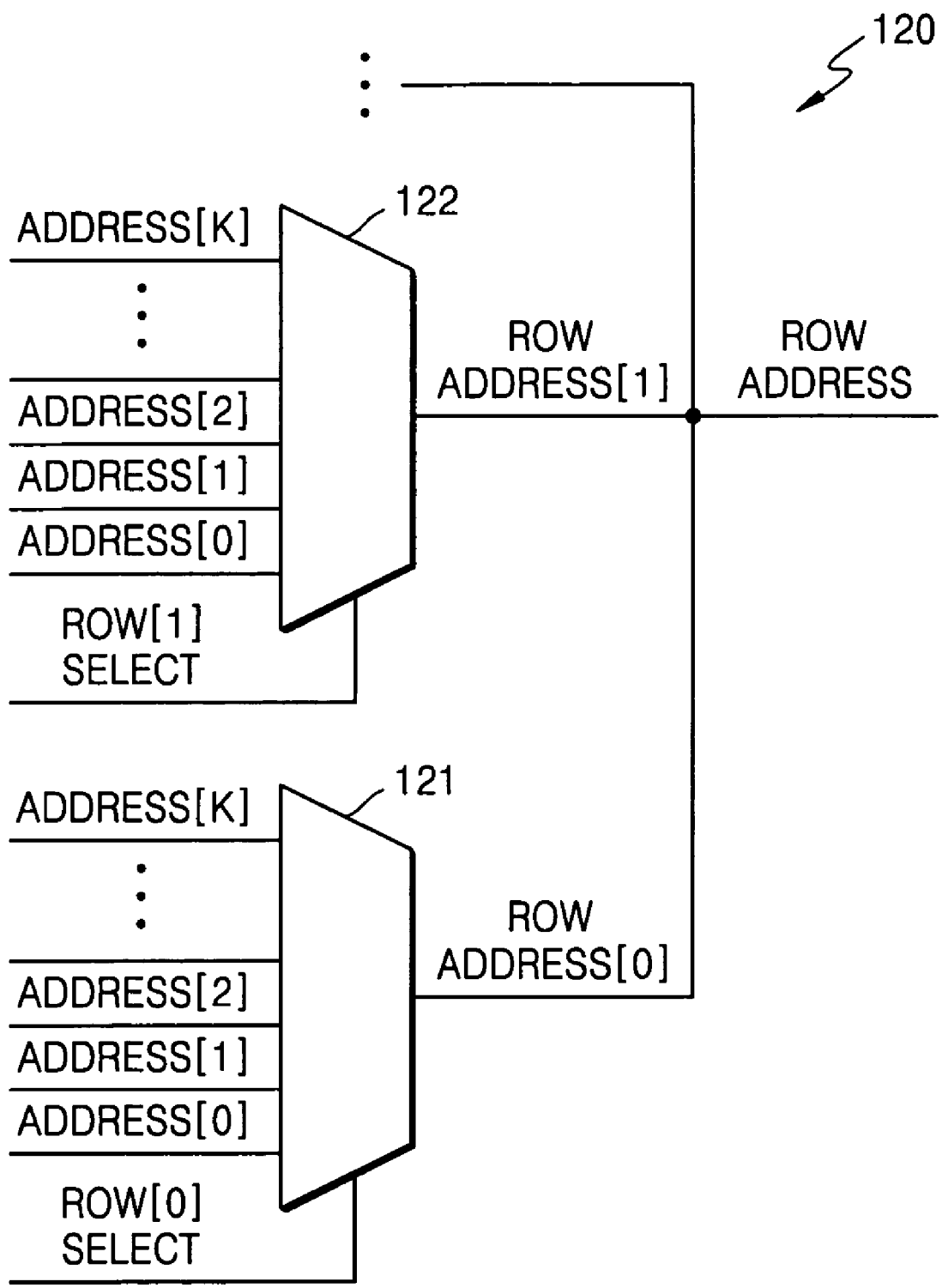

FIGS. 2A and 2B are exemplary detailed views of the memory address generating circuit 100 illustrated in FIG. 1. Referring to FIGS. 2A and 2B, the CAS address selecting circuit 110 includes a plurality of multiplexers 111, 112, . . . , and the RAS address selecting circuit 120 includes a plurality of multiplexers 121, 122, . . . .

The plurality of multiplexers 111, 112, . . . included in the CAS address selecting circuit 110 respond to corresponding CAS address select signals column[0] select and column[1], select an address signal among column address signals address[0] through address[N] of N bits input to the plurality of multiplexers 111, 112, . . . , and then output the selected address signal.

The plurality of multiplexers 121, 122, . . . included in the RAS address selecting circuit 120 respond to a corresponding RAS address select signals row[0] or row[1] select, select an address signal among row address signals address [0] through address[K] of K bits input to the plurality of multiplexers 121, 122, . . . , and then output the selected address signal.

Embodiments of memory address mapping methods using a memory address generating circuit and a memory controller will be described below. The memory address mapping methods described below relate to three cases: a first case that can minimize power consumption, a second case that can minimize memory access time, and a third case that can improve a certain operating performance ability but there is no advantage in terms of power consumption and the memory access time. A memory address appropriately used in other situations besides the one described above can be generated using other techniques, but such techniques are not difficult to those skilled in the related art, and thus their descriptions will be omitted.

Firstly, a memory address mapping method suitable for minimizing power consumption will be described.

FIGS. 3A through 3D illustrate an address mapping method using a memory address generating circuit or a memory controller according to an embodiment of the present invention. Referring to FIGS. 3A through 3D, a mapping method to minimize power consumption of a memory is illustrated. In the mapping method, first through fourth memory banks banks 0 through 3 are sequentially mapped.

Figure 3A:
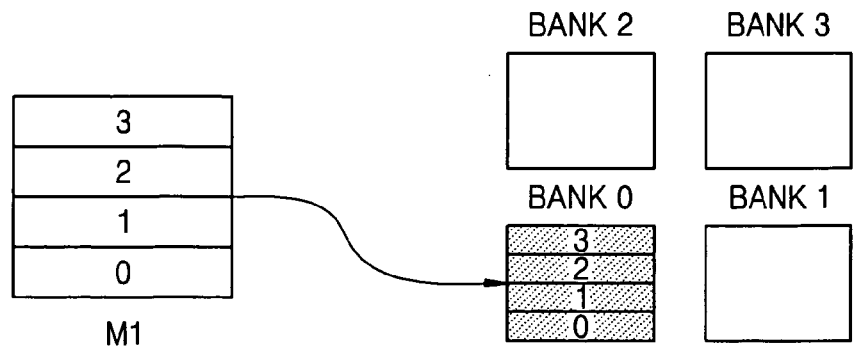
FIGS. 3A through 3D illustrate an address mapping method using a memory address generating circuit or a memory controller according to an embodiment of the present invention.
Figure 3B:
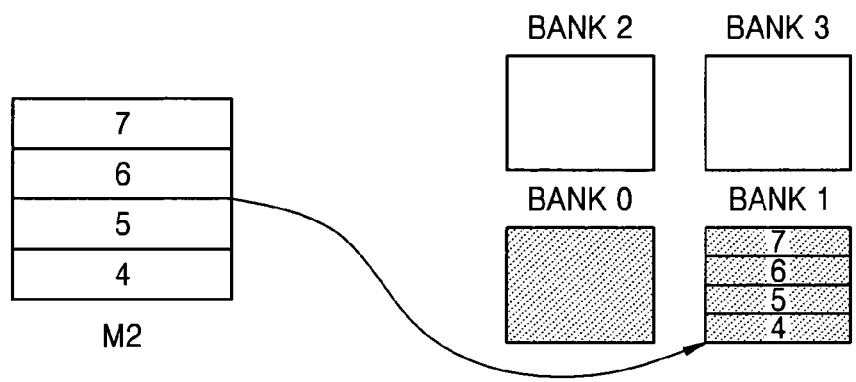
Figure 3C:
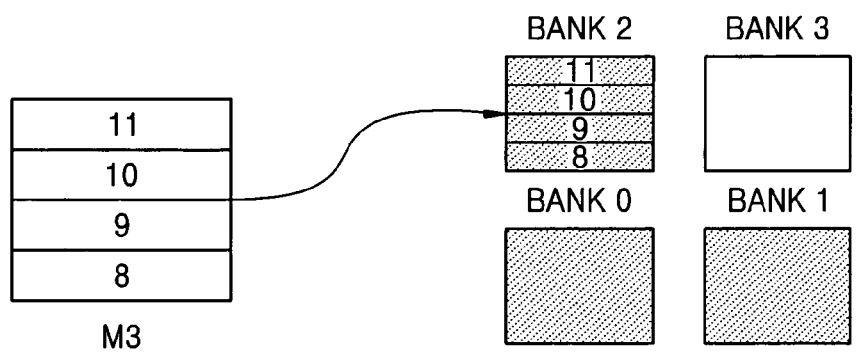
Figure 3D:
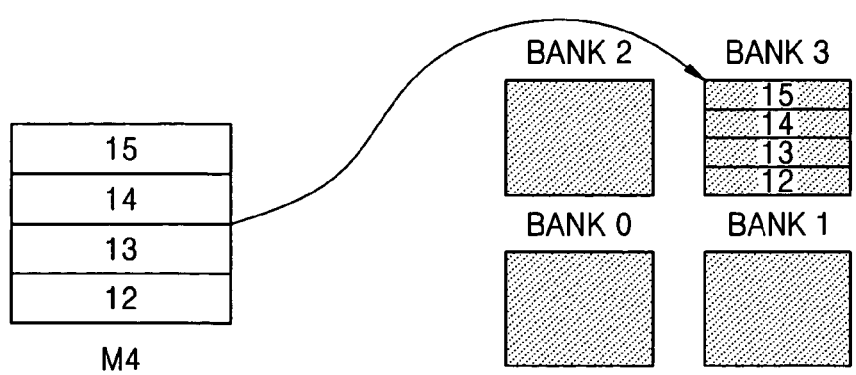

FIG. 3A is a view of a first memory map M1 and a memory region corresponding thereto, FIG. 3B is a view of a second memory map M2 and a memory region corresponding thereto, FIG. 3C is a view of a third memory map M3 and a memory region corresponding thereto, and FIG. 3D is a view of a fourth memory map M4 and a memory region corresponding thereto.

Referring to FIGS. 3A through 3D, a memory map is illustrated on the left and a memory bank (shaded portion) corresponding to the memory map is illustrated on the right. The numbers written in the first through fourth memory maps M1 through M4 indicate pages of the memory. For convenience of explanation, it is assumed that the memory includes four memory banks banks 0 through 3 and each of the memory banks banks 0 through 3 has four memory pages 0 through 15.

Referring to FIG. 3A, the first memory map M1 sequentially maps pages 0 through 3 of the first memory bank bank 0. Referring to FIG. 3B, the second memory map M2 sequentially maps pages 4 through 7 of the second memory bank bank 1. Referring to FIG. 3C, the third memory map M3 sequentially maps pages 8 through 11 of the third memory bank bank 2. Referring to FIG. 3D, the fourth memory map M4 sequentially maps pages 12 through 15 of the fourth memory bank bank 3.

When the memory is mapped as shown in FIGS. 3A through 3D, only the memory banks in use are refreshed and power can be selectively supplied. Thus, the power consumption of the memory can be minimized.

Secondly, a memory address mapping method suitable for minimizing the memory access time will be described.

FIGS. 4A through 4D illustrate an address mapping method using a memory address generating circuit or a memory controller according to another embodiment of the present invention. Referring to FIGS. 4A through 4D, a mapping method to minimize access time of a memory is illustrated. In the mapping method, single pages of first through fourth memory banks banks 0 through 3 are simultaneously mapped in a memory map.

Figure 4A:
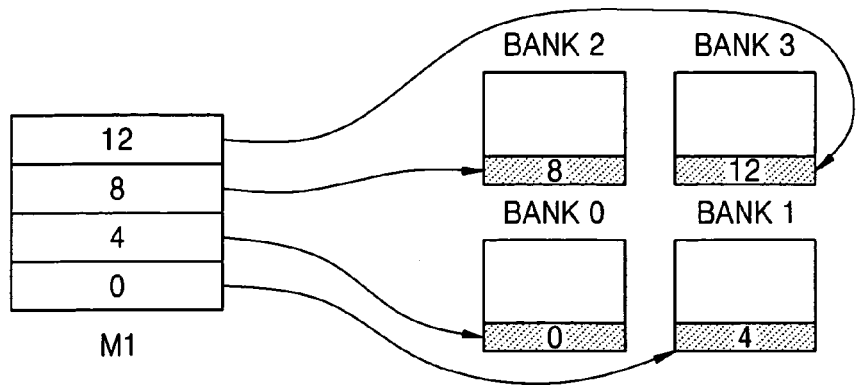
FIGS. 4A through 4D illustrate an address mapping method using a memory address generating circuit or a memory controller according to another embodiment of the present invention.
Figure 4B:
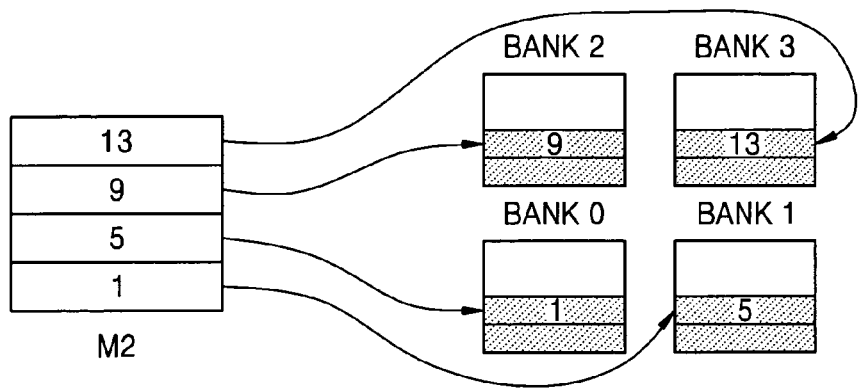
Figure 4C:
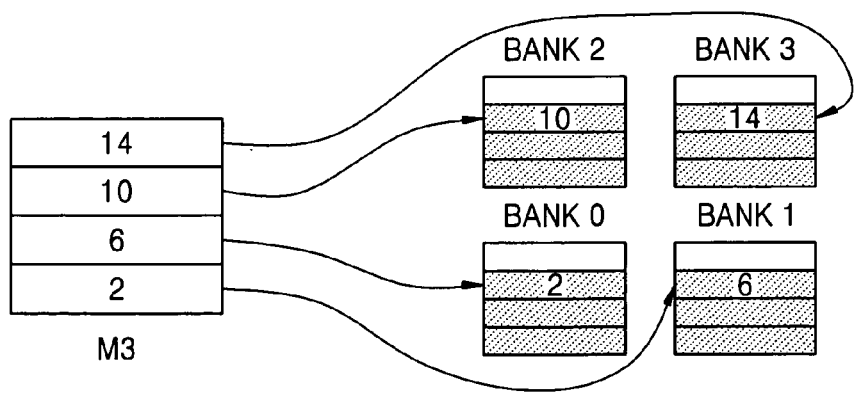
Figure 4D:
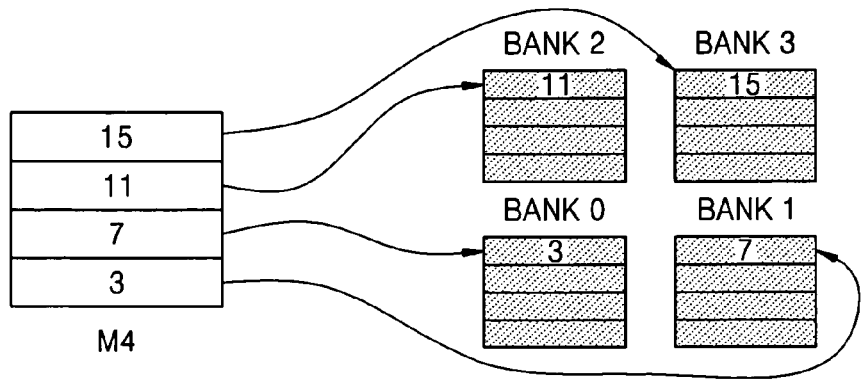

FIG. 4A is a view of a first memory map M1 and a memory region corresponding thereto, FIG. 4B is a view of a second memory map M2 and a memory region corresponding thereto, FIG. 4C is a view of a third memory map M3 and a memory region corresponding thereto, and FIG. 4D is a view of a fourth memory map M4 and a memory region corresponding thereto.

Referring to FIG. 4A, the first memory map M1 respectively selects a single page 0, 4, 8, and 12 from each of the memory banks banks 0 through 3 and then maps the selected pages 0, 4, 8, and 12. That is, the page 0 selected from the first memory bank bank 0, the page 4 selected from the second memory bank bank 1, the page 8 selected from the third memory bank bank 2, and the page 12 selected from the fourth memory bank bank 3 are sequentially mapped. Referring to FIG. 4B, the second memory map M2 respectively selects a single page 1, 5, 9, and 13 besides the selected pages 0, 4, 8, and 12 from each of the first through fourth memory banks banks 0 through 3 and then maps the selected pages 1, 5, 9, and 13. FIGS. 4C and 4D sequentially maps the rest of the pages 2, 6, 10, and 14, and 3, 7, 11, and 15, respectively, as described in FIGS. 4A and 4B.

Referring to FIGS. 4A through 4D, all of the first through fourth memory banks banks 0 through 3 can be selected in the first mapping method, and thus the assess time of the first through fourth memory banks banks 0 through 3 can be minimized. This method has higher power consumption than the method illustrated in FIGS. 3A through 3D, but this should be considered by the user when selecting an appropriate method of generating a memory address based on the environment in which the memory is accessed.

Lastly, a memory address mapping method suitable for an effective use of a memory will be described.

FIGS. 5A through 5D illustrate an address mapping method using a memory address generating circuit or a memory controller according to another embodiment of the present invention. Referring to FIGS. 5A through 5D, a mapping method considering both power consumption and access time is illustrated. In the mapping method, some of the first through fourth memory banks banks 0 through 3 can be used, and this mapping method is used when also desiring to reduce the memory access time.

Figure 5A:
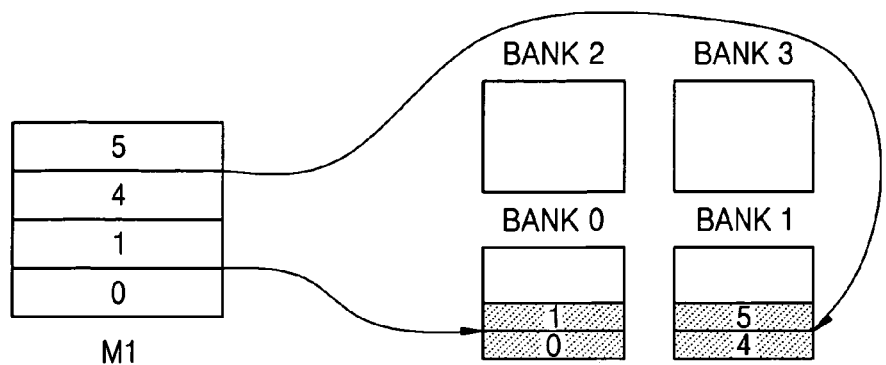
FIGS. 5A through 5D illustrate an address mapping method using a memory address generating circuit or a memory controller according to another embodiment of the present invention.
Figure 5B:
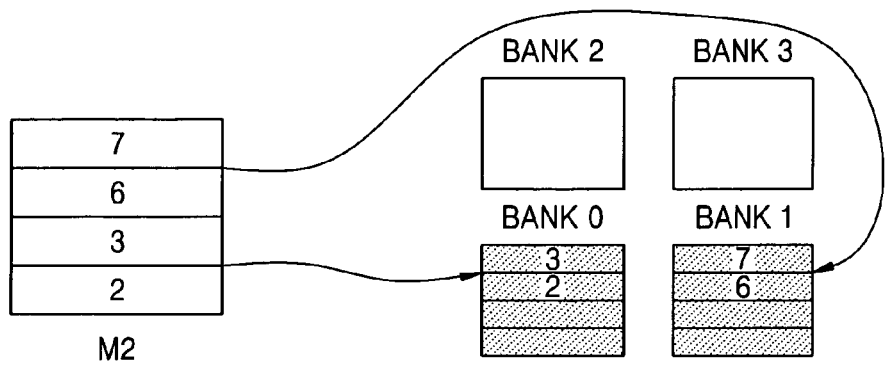
Figure 5C:
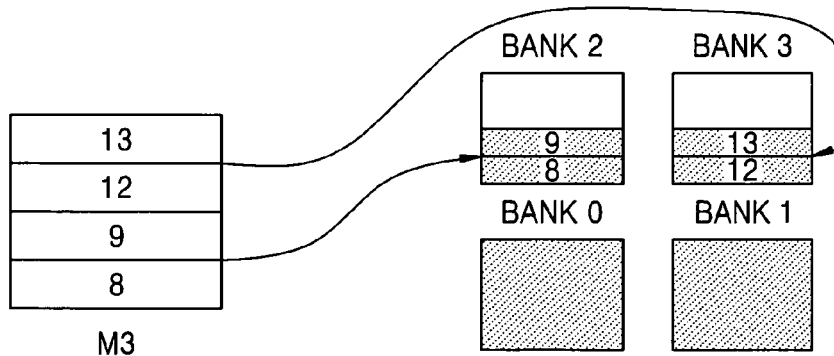
Figure 5D:
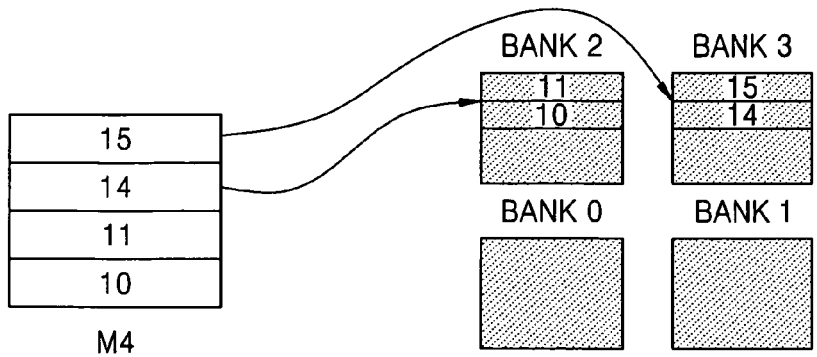

FIG. 5A is a view of a first memory map M1 and a memory region corresponding thereto, FIG. 5B is a view of a second memory map M2 and a memory region corresponding thereto, FIG. 5C is a view of a third memory map M3 and a memory region corresponding thereto, and FIG. 5D is a view of a fourth memory map M4 and a memory region corresponding thereto.

Referring to FIG. 5A, the first memory map M1 maps two pages 0 and 1, and 4 and 5 from each of the first and second memory banks banks 0 and 1, respectively. That is, two pages 0 and 1 from the first memory bank bank 1 and two pages 4 and 5 from the second memory bank bank 2 are sequentially mapped. Referring to FIG. 5B, the second memory map M2 sequentially maps the rest of the two pages 2 and 3, and 6 and 7 from the first and second memory banks banks 0 and 1, respectively. Referring to FIG. 5C, the third memory map M3 sequentially maps two pages 8 and 9, and 12 and 13 from each of the third and fourth memory banks banks 2 and 3, respectively. Referring to FIG. 5D, the fourth memory map M4 sequentially maps the rest of the pages 10 and 11, and 14 and 15 from each of the third and fourth memory banks banks 2 and 3, respectively.

Referring to FIGS. 5A through 5D, the power consumption increases compared to the embodiment illustrated in FIGS. 3A through 3D because two memory banks are used compared to only one memory bank in the embodiment illustrated in FIGS. 3A through 3D, but the access speed increases. In addition, compared to the embodiment illustrated in FIGS. 4A through 4D, the power consumption decreases but the access speed also decreases.

Therefore, the user should select the most suitable memory mapping method for a system in which the memory is to be accessed by comparing the advantages and disadvantages of the methods illustrated in FIGS. 3A through 3D, 4A through 4D, and 5A through 5D. The present invention provides the memory address generating circuit as illustrated in FIG. 1 and the memory controller including the memory address generating circuit so that the user can select one of the memory mapping methods.

According to a memory address generating circuit and a memory controller including the same as described above, a memory address can be freely generated according to the characteristics of a system a user wishes to use, and thus satisfy the user's needs whatever type of memory is used.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A memory address generating circuit for accessing a memory including a plurality of memory banks, each of the memory banks being divided into a plurality of pages of predetermined sizes, the memory address generating circuit comprising:
    a column address strobe (CAS) address selecting circuit which outputs a CAS address signal from a plurality of column address signals using a CAS address select signal of a plurality of CAS address select signals; and
    a row address strobe (RAS) address selecting circuit which outputs an RAS address signal from a plurality of row address signals using a RAS address select signal of a plurality of RAS address select signals,
    wherein the memory address generating circuit controls the CAS address select signals and the RAS address select signals to perform a memory mapping of the memory.

2. The memory address generating circuit of claim 1, wherein the CAS address selecting circuit comprises a plurality of multiplexers, each of the multiplexers outputting a CAS address signal selected by a corresponding CAS address select signal among the plurality of colunm address signals.

3. The memory address generating circuit of claim 1, wherein the RAS address selecting circuit comprises a plurality of multiplexers, each of the multiplexers outputting a RAS address signal selected by a corresponding RAS address select signal among the plurality of row address signals.

4. The memory address generating circuit of claim 1, further comprising a multiplexer which multiplexes an output signal of the CAS address selecting circuit and the RAS address selecting circuit.

5. The memory address generating circuit of claim 1, wherein the CAS address signal and the RAS address signals are generated to sequentially select the plurality of memory banks included in the memory.

6. The memory address generating circuit of claim 5, wherein the generated CAS address signal and the RAS address signal map the plurality of pages of the selected memory banks in a predetermined order.

7. The memory address generating circuit of claim 1, wherein the CAS address signal and the RAS address signal are generated to simultaneously select the plurality of memory banks included in the memory.

8. The memory address generating circuit of claim 7, wherein the CAS address signal and the RAS address signal simultaneously and sequentially map some of the pages among the plurality of pages in each of the selected memory banks.

9. The memory address generating circuit of claim 1, wherein the CAS address signal and the RAS address signal are generated to simultaneously select some of the plurality of memory banks included in the memory.

10. The memory address generating circuit of claim 9, wherein the CAS address signal and the RAS address signal simultaneously and sequentially map some of the pages among the plurality of pages in each of the selected memory banks.

11. A memory controller for accessing a memory including a plurality of memory banks, each of the memory banks being divided into a plurality of pages of predetermined sizes, the memory controller comprising:
    an address select control device which generates a plurality of column address strobe (CAS) address select signals and a plurality of RAS address select signals;
    an address generating device which generates a plurality of column address signals and a plurality of row address signals;
    a CAS address selecting circuit which outputs a CAS address signal from the plurality of column address signals using a CAS address select signal of the plurality of CAS address select signals; and
    a row address strobe (RAS) address selecting circuit which outputs an RAS address signal from the plurality of row address signals using an RAS address signal from the plurality of RAS address select signals, wherein the CAS address select signals and the RAS address select signals are controlled to perform memory mapping of the memory.

12. The memory controller of claim 11, wherein the CAS address signals and the RAS address signals are generated to sequentially select the plurality of memory banks included in the memory.

13. The memory controller of claim 12, wherein the CAS address signals and the RAS address signals sequentially map the plurality of pages of the selected memory banks in a predetermined order.

14. The memory controller of claim 11, wherein the CAS address signals and the RAS address signals are generated to simultaneously select each of the plurality of the memory banks included in the memory.

15. The memory controller of claim 14, wherein the CAS address signals and the RAS address signals simultaneously and sequentially map some of the pages among the plurality of pages of the selected memory banks.

16. The memory controller of claim 11, wherein the CAS address signals and the RAS address signals are generated to simultaneously select some of the banks among the plurality of the memory banks included in the memory.

17. The memory controller of claim 16, wherein the CAS address signals and the RAS address signals simultaneously and sequentially map some of the pages among the plurality of pages of the selected memory banks.

* * * * *